(12) United States Patent
Chevallier

(10) Patent No.: US 11,443,795 B2
(45) Date of Patent: Sep. 13, 2022

(54) SRAM WITH ADDRESS DEPENDENT POWER USAGE

(71) Applicant: Ambiq Micro, Inc., Austin, TX (US)

(72) Inventor: Christophe J. Chevallier, Palo Alto, CA (US)

(73) Assignee: Ambiq Micro, Inc., Austin, TX (US)

( * ) Notice: Subject to any disclaimer, the term of this patent is extended or adjusted under 35 U.S.C. 154(b) by 196 days.

(21) Appl. No.: 15/648,298

(22) Filed: Jul. 12, 2017

(65) Prior Publication Data

US 2019/0019550 A1 Jan. 17, 2019

(51) Int. Cl.
*G11C 11/418* (2006.01)
*G11C 11/419* (2006.01)
*G11C 5/02* (2006.01)

(52) U.S. Cl.
CPC ............ *G11C 11/418* (2013.01); *G11C 5/025* (2013.01); *G11C 11/419* (2013.01)

(58) Field of Classification Search
CPC .................................................... G06F 1/3287
USPC .......................................................... 365/226
See application file for complete search history.

(56) References Cited

U.S. PATENT DOCUMENTS

| 5,923,605 | A | * | 7/1999 | Mueller | G11C 11/4087 365/230.03 |
|---|---|---|---|---|---|
| 7,499,345 | B2 | * | 3/2009 | Campardo | H02M 3/07 327/537 |
| 2005/0041512 | A1 | * | 2/2005 | Kim | G11C 5/063 365/230.03 |
| 2006/0023555 | A1 | * | 2/2006 | Morishima | G11C 7/1051 365/230.03 |
| 2010/0070695 | A1 | * | 3/2010 | Baek | G06F 12/023 711/104 |
| 2011/0025375 | A1 | * | 2/2011 | Takayanagi | H03K 19/0013 326/36 |
| 2013/0297952 | A1 | * | 11/2013 | Miyake | G06F 1/26 713/300 |
| 2014/0191328 | A1 | * | 7/2014 | Tsuruta | H01L 27/0207 257/371 |
| 2016/0071574 | A1 | * | 3/2016 | Hess | G11C 11/419 365/156 |
| 2017/0053689 | A1 | * | 2/2017 | Noguchi | G06F 1/3275 |

* cited by examiner

*Primary Examiner* — Min Huang
(74) *Attorney, Agent, or Firm* — David R. Stevens; Stevens Law Group

(57) ABSTRACT

A SRAM system having an address scheme and/or wire control layout. By preferentially accessing a defined address range mapped to SRAM array blocks located near a controller, significant power savings can be realized. In one embodiment, the address scheme determines a range physically closer to a central control location. In another embodiment, the wire control layout reduces number and length of active wires, further reducing power consumption.

23 Claims, 6 Drawing Sheets

SRAM WITH ADDRESS DEPENDENT POWER USAGE

FIELD OF THE INVENTION

A Static Random Access Memory (SRAM) circuit having optimized power usage dependent on the address range being accessed is described. Components, layouts, and methods for reducing power requirements during an SRAM retention mode are described.

BACKGROUND

SRAM circuits that store digital information are widely used in a variety of mobile and handheld devices, notably smart phones, tablets, laptops, and other consumer electronics products. Solid State memory can include stand-alone memory circuits, with a dedicated substrate, or embedded memory circuits, where the SRAM circuit shares a substrate with other electronic components. Typically, SRAM circuits consists of arrays of SRAM bit cells, and surrounding circuits such as decoders, sense amplifiers, write buffer, timers and control logic. The bit cell consists of a number of transistors. The most common SRAM cell uses six CMOS transistors connected as a latch with two pass gates. While fast and reliable, SRAM memory circuits requires substantially continuous power for operation, making efficient electrical power usage a key concern.

In recent years, due to the growth of portable electronics, there has been a push to decrease the power of the circuits used in portable electronic appliances. With a lower power, typically smaller batteries can be used. The power consumption of a circuit may be reduced by using a lower supply voltage, or by reducing the amount of internal capacitance being charged and discharged during the operation of the circuit. A memory that uses less power will be not drain a battery supply as much, and therefore a system with such memory would not need as frequent battery recharging.

In some systems, a portion of the SRAM memory can be configured to operate with a reduced power, as compared to other portion of the SRAM. One solution would be to use multiple independent circuits, which are all small enough to have low power consumption. However, the juxtaposition of many independent circuits would take much more space, and therefore have a higher cost, than one large SRAM circuit.

Such a device, with a preferred portion with reduced power consumption, would therefore be useful to enable lower power systems.

DETAILED DESCRIPTION

Figure 1:
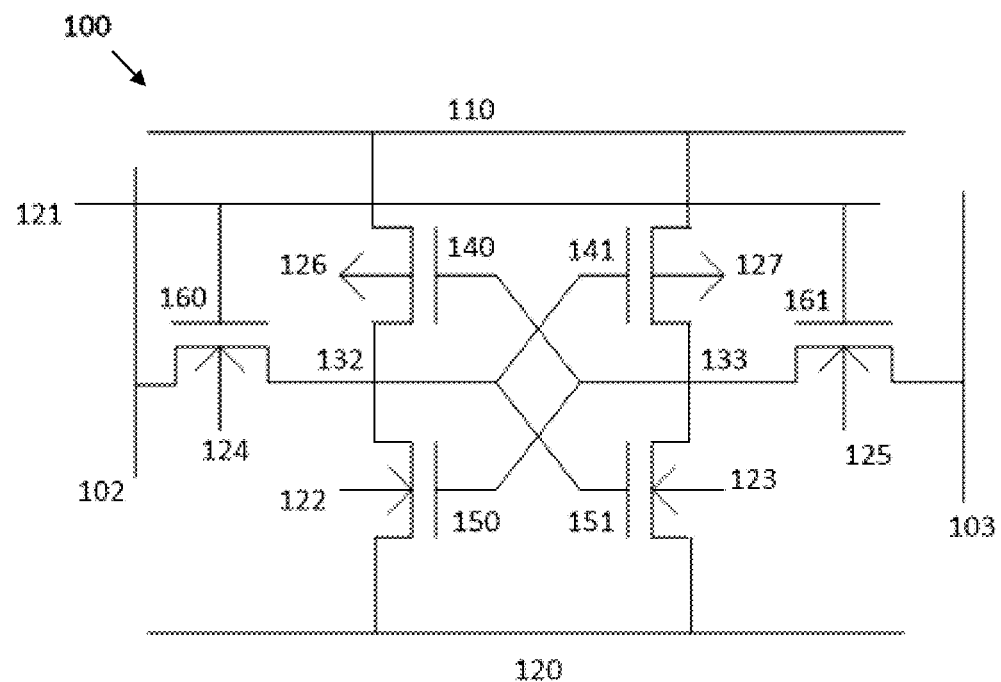
FIG. 1 schematically illustrates one example of an SRAM cell suitable for use in an SRAM array.

FIG. 1 schematically illustrates a diagram of an SRAM cell 100 for holding data, including stored bits or instructions. SRAM cell 100 consists of an array supply line 110 and array ground line 120, word line 121, bit line 102 and bit line bar 103, pull up transistors 140 and 141, with the bulk of transistors 140 and 141 respectively named 126 and 127, pull down transistors 150 and 151, with the bulk of transistors 150 and 151 respectively named 122 and 123, pass gate transistors 160 and 161, with the bulk of transistors 160 and 161 respectively named 124 and 125. Nodes 132 and 133 stored a signal representative of the data intended to be stored in this SRAM cell 100. In the most typical implementation of existing art, nodes 126 and 127 are tied together to node 110, nodes 122, 123, 124 and 125 are tied to node 120.

SRAM cells can be connected to peripheral circuitry. Both SRAM cells and peripheral circuitry can be built from various transistor types and operate in different power domains that take advantage of various transistor characteristics. For example, SRAM circuits can be built using MOS transistors. MOS transistors have a gate, a source, a drain and a bulk node. By applying a voltage on the gate the amount of current that can flow from the drain to the source can be modulated. One of the main characteristics of MOS transistors is its threshold voltage. This quantity, in its simplest definition, substantially is the voltage applied on its gate in order to pass current. With a sufficiently high supply voltage, circuitry can be build using high threshold voltage transistors. The advantage of a high threshold voltage transistor is that when its gate is turned off, the leakage from drain to source is very low, and the device consumes very little power. However, this high threshold voltage transistor cannot be used efficiently with a low supply voltage, because the signal developed in the circuitry under low supply is not high enough to let the high threshold voltage transistor pass a large amount of current, and therefore achieve proper switching speed. When proper switching speed is needed in a circuit with a low supply, low threshold voltage transistors can be used. In some embodiments, SRAM cells can be built with high threshold voltage transistors, while the peripheral circuitry, operating in one or more distinct power domains, is built with low threshold voltage transistors.

As discussed with respect to U.S. patent application Ser. No. 15/412,039, titled "SRAM with Active Bias", filed Jan. 22, 2017, the disclosure of which is herein incorporated in its entirety by reference; arrays of SRAM cells can be operated in different modes. Exemplary modes may include, without limitation: (i) an active mode during which write and read operations are performed; (ii) a standby mode where the SRAM circuit is idle, but can quickly switch back into active modes; (iii) a retention mode where the voltage supply for the SRAM array, including the SRAM cells, is reduced, providing for lower power consumption by the SRAM array while maintaining the data content stored in the SRAM array; and (iv) a power down mode where the majority of the circuitry inside the SRAM facility is powered down, and the data stored in the SRAM array is lost.

In some embodiments, the voltage supply of the SRAM cells in retention mode can be lowered to reduce the overall voltage across the transistors of the SRAM cells with a concomitant reduction in power dissipation. An alternative practice in a retention mode is to raise the ground supply of the SRAM cells in the SRAM array, again, to reduce the overall voltage across the transistors of the SRAM cells. However, the reduction in voltage across the transistors of the SRAM cells, either by lowering the supply voltage or raising the ground supply, is limited by the threshold voltages of the transistors in each cell. Once the voltage across the transistors of the SRAM cells nears the threshold voltage of the transistors of the SRAM cells, the SRAM cell's ability to maintain its proper state is compromised.

According to one embodiment, data integrity may be maintained by lowering the threshold voltages of selected transistors. Various permutations of the embodiment are anticipated. For example, an SRAM facility could have 2 modes of retention. A first mode may be a mode where the well and substrate of SRAM cell transistors are biased at (respectively) power supply and ground level. In this mode, the well supply or well node and the source or drain of the PMOS transistor are both coupled to the power supply and the substrate supply or substrate node and the source or drain of the NMOS transistor are both coupled to the ground supply. A second mode may be a mode where the well and substrate of the SRAM cell transistors are biased at lower well voltage and higher substrate voltage. In this second mode, the well supply or well node is supplied at a lower, i.e., different, voltage than the source or drain of the PMOS transistor and the substrate supply or substrate node is supplied at a higher, i.e., different, voltage than the source or drain of the NMOS transistor.

In operation, bias levels can be determined by testing to determine its functionality for retention at low voltage. As an example, a retention test (write pattern, lower array supply to retention voltage, wait a certain amount of time (typically in order of milliseconds), raise array supply to nominal voltage, read and compare pattern) is applied with varying retention voltages. The results of such a test can be stored in a register. During, for example, retention mode, the information from the register is used to bias the SRAM cell transistors to the minimum passing retention level. In one embodiment, the retention test can be performed once during an initial test phase, and the result of the test can be stored permanently on the integrated circuits, for example in non-volatile memory cells. Alternatively, the test may be performed each time the SRAM cell transistors are powered up, or at regular intervals. Additionally, in some embodiments the techniques described herein may be further enhanced by using a temperature detector to provide information useful for bias level selection.

In one embodiment, distinct well and substrate voltages can optionally be supplied to an SRAM array block incorporating a plurality of SRAM cells. The SRAM array block can be connected to peripheral circuitry such as word line decoders adapted to decode the data asserted on the address lines apply the results of the decode to word lines; bit line decoders adapted to decode the data asserted on the address lines and apply the results and select the associated bit lines for reading or writing of data; and a sense amp and write driver to respectively read or apply the data associated with the selected cell or cells by way of lines. A control block can be used to manage which mode of operation is selected, and generate the proper control signals to control the other SRAM facility blocks.

In another embodiment, an SRAM array block incorporating a plurality of SRAM cells can support peripheral circuitry substantially located at designated locations with respect to the SRAM cell. For example, as discussed with respect to U.S. patent application Ser. No. 15/345,229, titled "SRAM with Multiple Power Domains", filed Nov. 7, 2016, the disclosure of which is herein incorporated in its entirety by reference; peripheral circuitry can be centrally located with respect to SRAM array blocks. For example, physical block placement for a physical implementation of a disclosed circuit can include an SRAM array divided into a cluster array of four (4) memory array blocks, physically configured to form a central region for physical placement of address path facility and data path facility circuit and logic blocks. Located within that central region is a bit line decoder divided into four (4) bit line decoder blocks, each respectively located in the central region formed by the cluster array of four memory array blocks. Likewise, a word line decoder can be divided into two (2) decode blocks, each respectively located in the central region formed by the cluster array of four memory array blocks. A sense amp and write decoder can be divided into two (2) sense amp and write decode blocks, each respectively located in the central region formed by the cluster array of four memory arrays. By physically placing the physical blocks of circuits such as a control facility, bit or word line decoders, at or near the physical center of the physical implantation of the SRAM array blocks, capacitance on the internal buses and signals can be significantly reduced. Using this physical placement, power consumption may be further reduced in some embodiments by only activating a single set of signals to a single memory array to operate the single memory array during a selected memory read or memory write operation.

Other embodiments may comprise a cluster array of two (2) memory array blocks physically configured to form a central region for physical placement of address path and data path facilities, or may comprise, for example, a cluster of memory array blocks physically configured to form a central region for physical placement of address path and data path facilities. Address and data path facilities can operate under distinct power and voltage domains. For example, SRAM facility can include a power supply facility adapted to develop a first voltage and a second voltage, with the second voltage being different from the first voltage. The address path facility can be adapted to receive the first voltage; and the data path facility adapted to receive the second voltage. Advantageously, for those embodiments that use a lower supply voltage in the data path, the SRAM circuit active power, which is the sum of the power of all nodes switching, is reduced. It is to be noted that not all portions of the data path need to be in the low power domain to achieve a power reduction.

Figure 2:
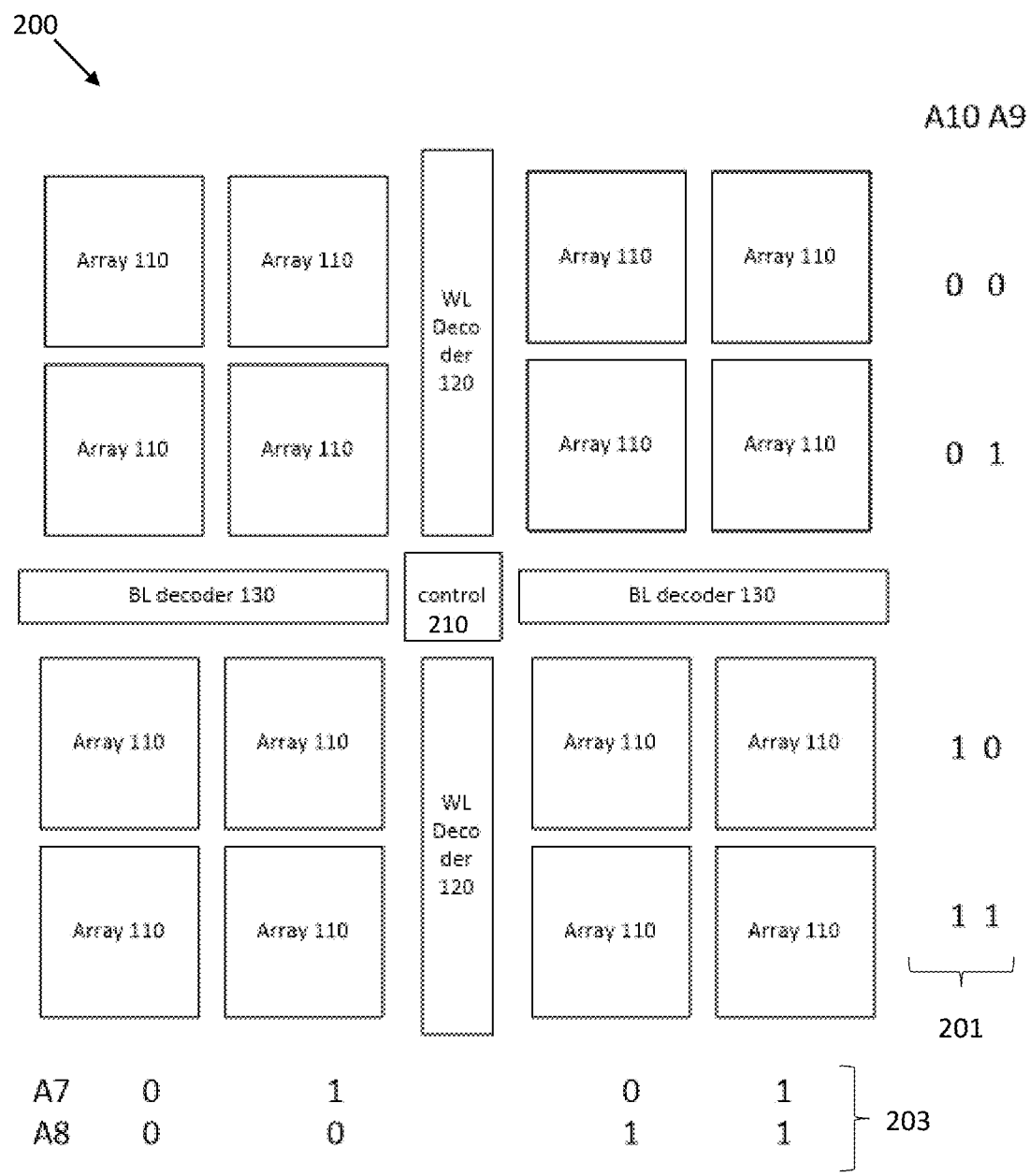
FIG. 2 illustrates an SRAM array with centrally located control and one possible address mapping embodiment.

FIG. 2 illustrates one embodiment of an SRAM system 200 with centrally located address and data circuitry (i.e. peripheral circuits), with respect to surrounding SRAM array blocks 110. Peripheral circuits, optionally including one or more transistor types distinct from those transistor types in the SRAM array blocks 110, and optionally operating within distinct power domains, are physically positioned substantially within boundaries of the SRAM array blocks 110. Peripheral circuits can include controller 210, word line decoders 120, and bit line decoders 130, as well as level shifters, voltage regulators, or other power/voltage control subsystems. As is apparent from the Figure, the controller 210 is centrally located, and the word and bit line decoders positioned to extend outward from the controller 210 along lanes defined by separation of SRAM array blocks 110. The lanes between SRAM array blocks 110 can be of identical size and spacing, or as in the illustrated FIG. 2, divided to include narrow and broad lanes, with the peripheral circuitry located in the broad lanes. In other contemplated embodiments, a range of lane widths can be used, and/or a non-regular layout of SRAM array blocks 110 utilized. In some embodiments, at least a portion of the peripheral circuitry can extend outside the boundary of the SRAM array blocks 110. In still other embodiments, a controller can be situated on one side of the SRAM array blocks 110.

FIG. 2 also illustrates one embodiment of a bit mapping approach, seen with reference to address subfields 201 and 203. In this example a field of 2048 words, addressed by 11 address bits from subfields A0 to A10 is assumed. The Figure illustrates sixteen (16) separate SRAM arrays arranged in linear blocks. The upper address bits A10, A9, A8 and A7 decode the sixteen arrays. In the Figure, the address value of 0000 decodes the upper left array. The address value of 1111 (A10-A7) decodes the bottom right array. The address range A6 to A0 decodes words inside the array and the precise order is not critical. While easy to implement, this arrangement can be improved by taking advantage of the central positioning of the controller 200 and available power characteristics, as seen in FIG. 3.

In some embodiments, power usage can be further lowered by preferentially using selected arrays for data write and read. For example, a controlling software data system can be connected and arranged to direct commonly used data in and/or out of the SRAM array blocks 110, with preferential use of the subset of arrays placed adjacent to a central or other designated location. This designated location can include controller 210 and other peripheral circuits.

Figure 3:
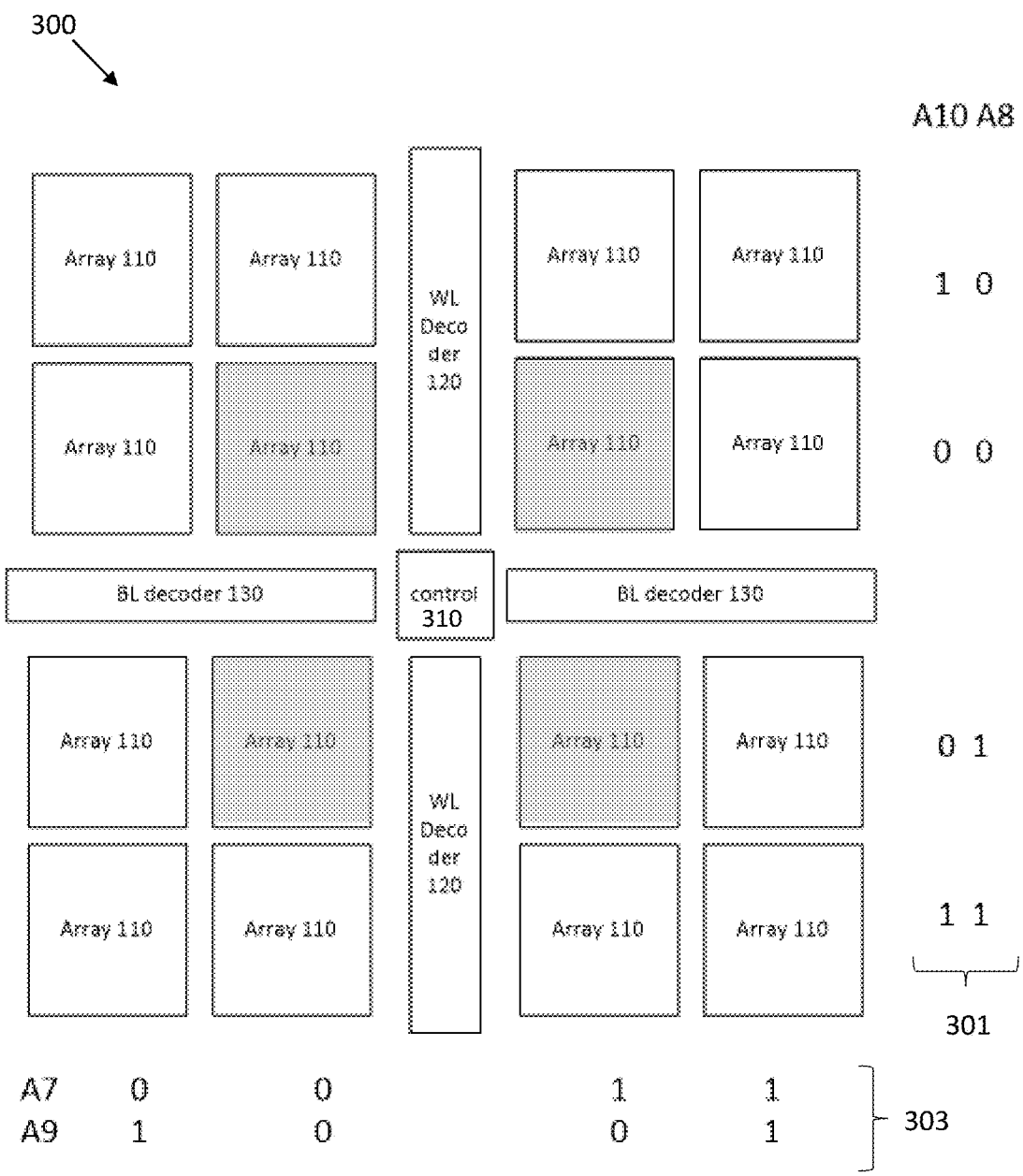
FIG. 3 illustrates an SRAM array with centrally located control and an improved address mapping embodiment.

FIG. 3 illustrates an SRAM system 300 with a centrally located controller 310 similar to that discussed with respect to FIG. 2 and with an improved address mapping embodiment. In contrast to FIG. 2, the embodiment of FIG. 3 illustrates an optimized mapping configuration, where the 16 arrays are decoded so that when top order addresses A10 and 9 are at 0, the selected word is in one of the four SRAM array blocks 110 (designated in gray shading) closest to the center of the chip. Control circuitry can be placed there to generate some or all of the important SRAM signals: address, input data, control signals such as Read, Write or byte write modes. In alternative embodiments where the controller can be situated on one side of the SRAM array blocks 110, the address ranges can be similarly modified so that SRAM array blocks 110 near to the controller are mapped to upper addresses.

Figure 4:
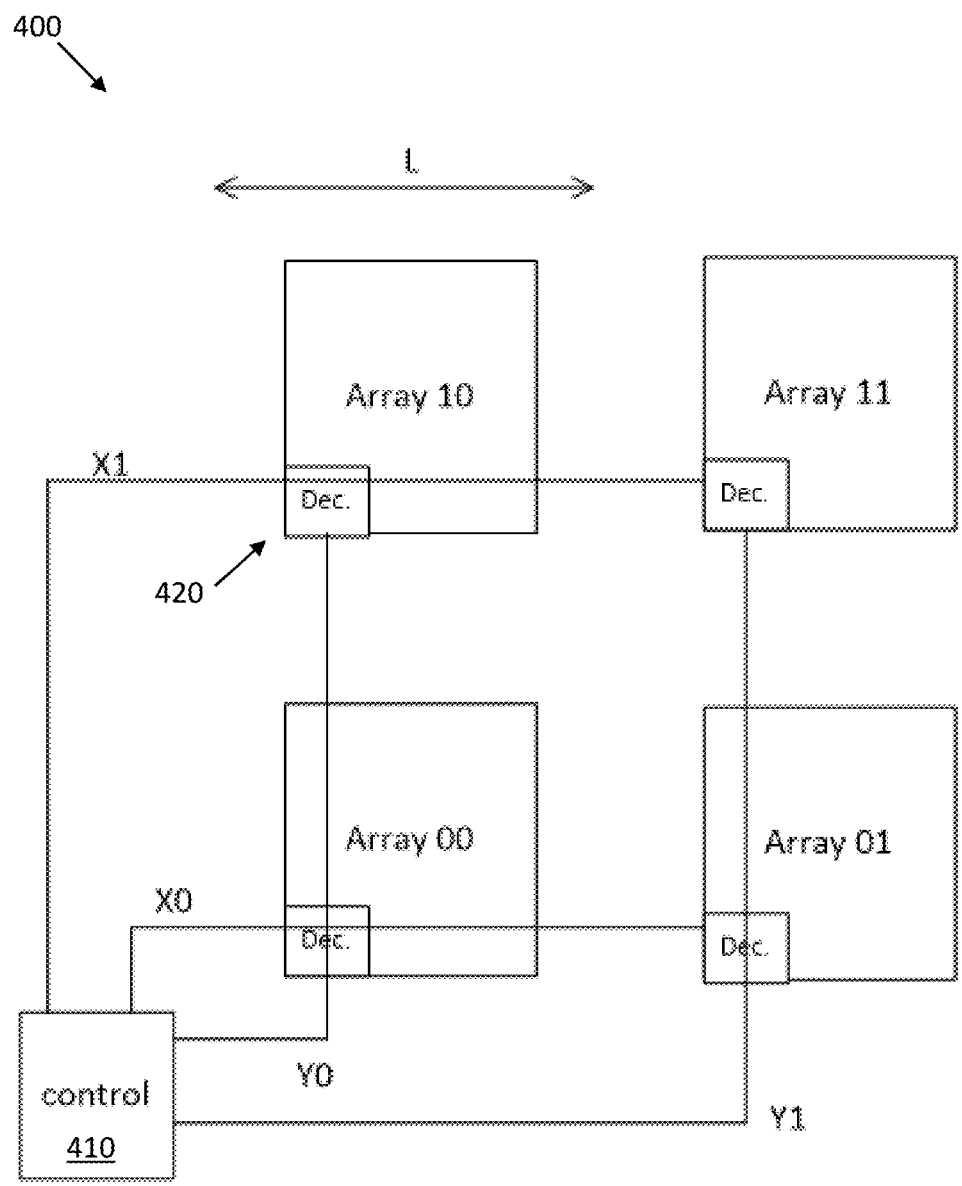
FIG. 4 illustrates decoding of a signal going to an array according to one implementation.

FIG. 4 illustrates decoding of a signal going to an electronic array system 400 according to one implementation. FIG. 4 describes a way to assert signals from a central location to a number of physically distributed array blocks, including SRAM array blocks. It can be applied to FIG. 2 or FIG. 3, in which case the blocks are SRAM arrays and the central location is decoding circuitry and logic controlling one or more signals such as address, data and control functions. FIG. 4 illustrates a scheme for propagating one signal that optimizes area. In the Figure, the distance L indicates distance between a centerline of lanes of successive SRAM array blocks. The combination of FIG. 4 and Table 1 below describes how each array is reached, the total length of the lines being activated, and which lines are activated:

TABLE 1

| Array 00 | 2 L | Lines X0, Y0 |
| Array 01 | 3 L | Lines X0, Y1 |
| Array 10 | 3 L | Lines X1, Y0 |
| Array 11 | 4 L | Lines X1, Y1 |

Typically, lines are activated in two directions, and decode logic at the array level selects the block to be activated. FIG. 4 illustrates a quadrant of an SRAM circuit such as disclosed with respect to FIGS. 2 and 3, having a plurality of arrays and at least one signal meant to operate on one of the plurality of arrays. The origin of the signal is in this example in the lower left corner marked as "control" and is directed to a "decoder" respectively associated with each array. For the purposes of this disclosure, signal lines in the Figures can illustrate multiple signal lines, with a grouped physical layout of signal lines, including parallel line layouts, or signal line layouts that are substantially contiguous. In some embodiments, however, signal line layouts may not be grouped, with one or more signal lines having greatly separated physical layouts.

For the purpose of illustration, consider a read signal necessary to turn on a set of sense amplifiers located in or near each array, but the same circuit principle could be applied to other signals. In FIG. 4, the combination of the read signal, a X select signal along the X direction and a Y select signal along the Y direction, will determine which set of sense amplifiers is turned on. In the case of FIG. 4, there will be 5 routed signals: 2 X signals, 2 Y signals and one read signal.

Figure 5:
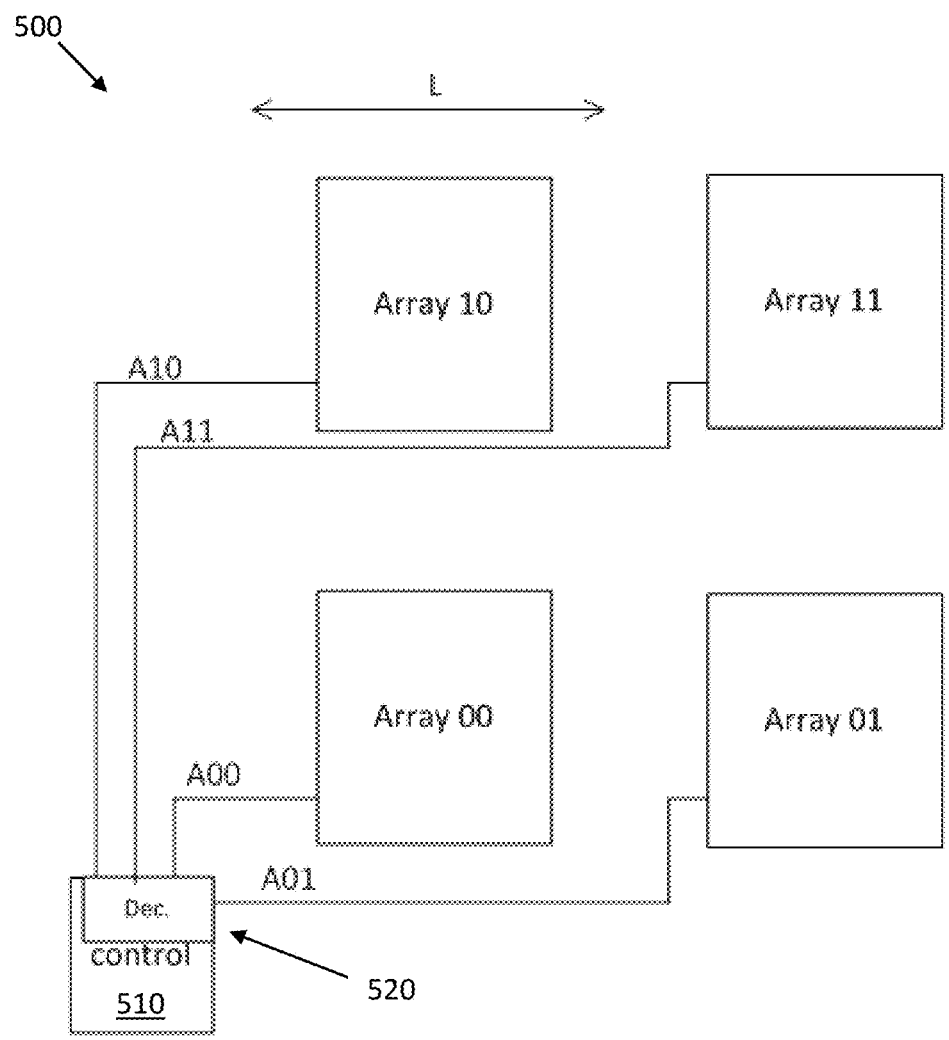
FIG. 5 illustrates decoding of a signal going to an array according to an improved implementation with reduced overall line length.

As an alternative to an area optimized layout such as disclosed in FIG. 4, FIG. 5 illustrates decoding of a signal going to an electronic array system 500 with minimized or reduced line length (again measured as a length L corresponding to distance between a centerline of lanes of successive array blocks). FIG. 5 illustrates asserting signals from a designated central location, where the decoding of the signal to be propagated is done in the designated central location, and only one line going to one array is activated. This scheme reduces the length of line being activated.

In FIG. 5, the combination of the read signal, X and Y select signals can be performed in the left corner location, and the resulting output signals routed to arrays and sense amplifiers. In the case of FIG. 5, there are 4 routed signals, the output of the combinations of read, 2X and 2Y signals in the left corner location. These 4 signals are the 4 read control wires going respectively to the 4 arrays as seen in the below Table 2 and with reference to FIG. 5.

TABLE 2

| Array 00 | 0 L | Line A00 |
| Array 01 | 1 L | Line A01 |
| Array 10 | 1 L | Line A10 |
| Array 11 | 2 L | Line A11 |

In FIG. 5 the read control wire extending to the array closest to the left corner location, where the combination is performed, is very short. Comparing FIG. 4 to FIG. 5, the approach in FIG. 5 requires on average length 1L to reach an array (i.e. the average of 0, 1, 1 and 2 lines). In contrast, the approach illustrated in FIG. 4 requires on average length 3L.

Figure 6:
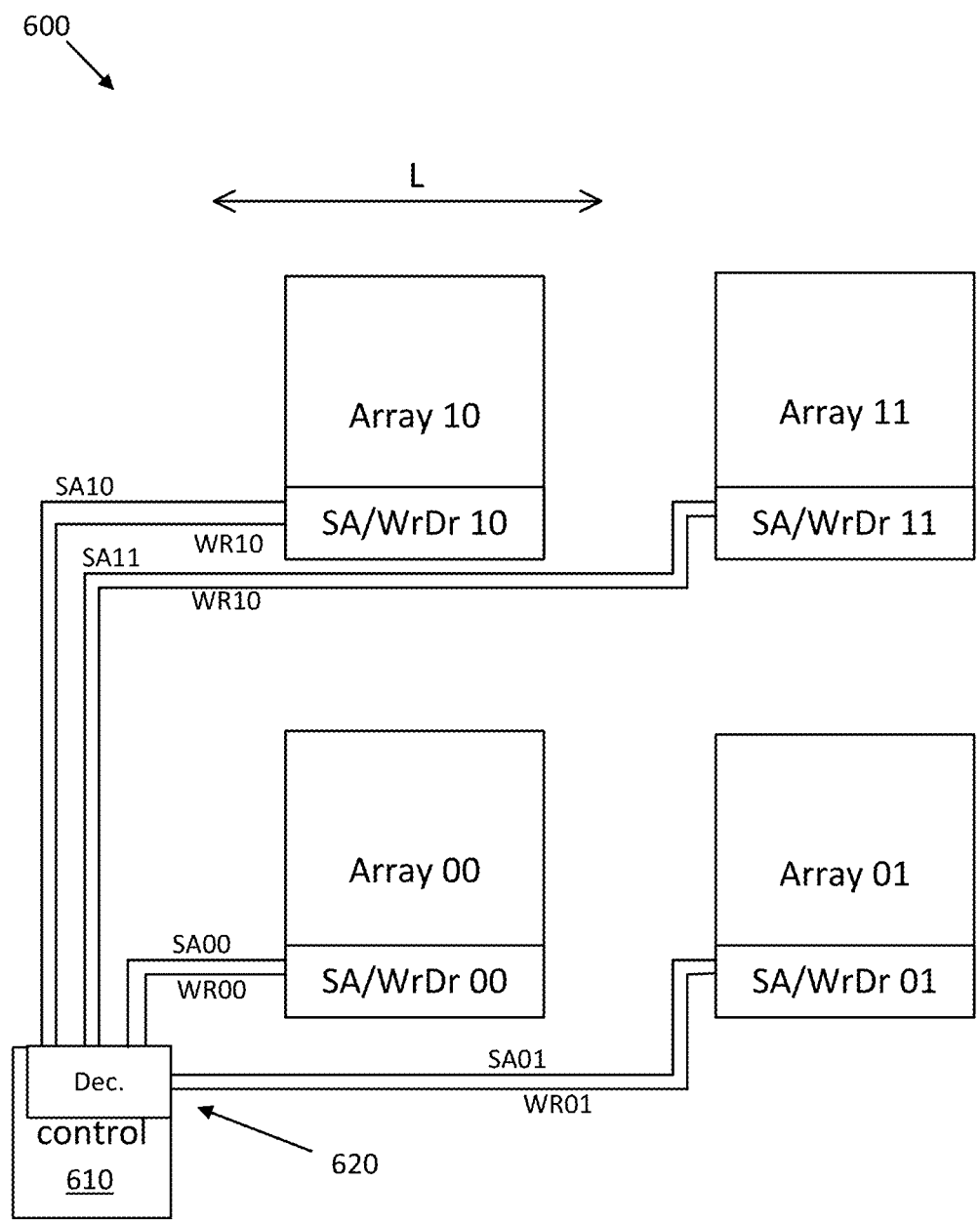
FIG. 6 illustrates positioning of sense amplifiers and write drivers with respect to multiple arrays according to one implementation.

FIG. 6 illustrates positioning of sense amplifiers and write drivers with respect to multiple arrays according to one implementation. Generally, systems 600 can include multiple arrays (e.g. Array 00, 01, 10, 11) that can be selectively accessed by WL decoders and BL decoders (not shown). Sense amplifiers, write drivers, and/or other circuitry can be positioned adjacent to at least some of the multiple arrays and can be enabled by multiple lines such as SA00, SA01, SA10, SA11, WRDR00, WRDR01, WRDR10 and WRDR11. The multiple arrays are accessible and controllable with one or more control signals. In operation, only circuitry connected to accessed arrays is enabled, greatly reducing overall power usage. Also, similar to signal path length discussed with respect to FIG. 5, the one or more control signals to enable the circuitry and connected to accessed multiple arrays are generated in a designated location such as controller 610 having associated decoders 620. As with the embodiment of FIG. 5, path length is reduced to an average length 1L to reach an array.

In the foregoing description, reference is made to the accompanying drawings that form a part thereof, and in which is shown by way of illustration specific exemplary embodiments in which the disclosure may be practiced. These embodiments are described in sufficient detail to enable those skilled in the art to practice the concepts disclosed herein.

Reference throughout this specification to "one embodiment," "an embodiment," "one example," or "an example" means that a particular feature, structure, or characteristic described in connection with the embodiment or example is included in at least one embodiment of the present disclosure. Thus, appearances of the phrases "in one embodiment," "in an embodiment," "one example," or "an example" in various places throughout this specification are not necessarily all referring to the same embodiment or example. Furthermore, the particular features, structures, databases, or characteristics may be combined in any suitable combinations and/or sub-combinations in one or more embodiments or examples. In addition, it should be appreciated that the figures provided herewith are for explanation purposes to persons ordinarily skilled in the art and that the drawings are not necessarily drawn to scale.

In general, in this disclosure the terms assert and negate may be used when referring to the rendering of a signal, signal flag, status bit, or similar apparatus into its logically true or logically false state, respectively, and the term toggle to indicate the logical inversion of a signal from one logical state to the other. Alternatively, the mutually exclusive Boolean states may be referred to as logic_0 and logic_1. Consistent system operation can be obtained by reversing the logic sense of all such signals, such that signals described herein as logically true become logically false and vice versa. Furthermore, it is of no relevance in such systems which specific voltage levels are selected to represent each of the logic states.

Reference to a facility or a system can mean a circuit or an associated set of circuits adapted to perform a particular function regardless of the physical layout of an embodiment thereof. Thus, the electronic elements comprising a given facility may be instantiated in the form of a hard macro adapted to be placed as a physically contiguous module, or in the form of a soft macro the elements of which may be distributed in any appropriate way that meets speed path requirements. In general, electronic systems comprise many different types of facilities, each adapted to perform specific functions in accordance with the intended capabilities.

Embodiments in accordance with the present disclosure may be embodied in whole or in part as an apparatus, method, or computer program product. Accordingly, the present disclosure may take the form of an entirely hardware-comprised embodiment, an entirely software-comprised embodiment (including firmware, resident software, micro-code, etc.), or an embodiment combining software and hardware aspects that may all generally be referred to herein as a "circuit," "module," or "system." Furthermore, embodiments of the present disclosure may take the form of a computer program product embodied in any tangible medium of expression having computer-usable program code embodied in the medium.

Any flow diagrams and block diagrams in the attached figures illustrate the architecture, functionality, and operation of possible implementations of systems, methods, and computer program products according to various embodiments of the present disclosure. In this regard, each block in the flow diagrams or block diagrams may represent a module, segment, or portion of code, which comprises one or more executable instructions for implementing the specified logical function(s). It will also be noted that each block of the block diagrams and/or flow diagrams, and combinations of blocks in the block diagrams and/or flow diagrams, may be implemented by special purpose hardware-based systems that perform the specified functions or acts, or combinations of special purpose hardware and computer instructions. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flow diagram and/or block diagram block or blocks.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

The invention claimed is:

1. A SRAM circuit comprising:
   arrays of SRAM bit cells, each capable of storing a bit of information, that together define an address bitmap, each array of the arrays of SRAM bit cells including a sense amplifier and a write driver;
   peripheral circuitry able to generate selected control, data, and address signals, connected to the arrays of SRAM bit cells and positioned at a designated location, the peripheral circuitry including at least one array decoder for each array of the arrays of SRAM bit cells located at the designated location and signal lines coupling the at least one array decoder to the sense amplifier and the write driver of the each array, the sense amplifier and the write driver of each array of the arrays of SRAM bit cells not being at the designated location and being adjacent the arrays of SRAM bit cells; and
   wherein a subset of arrays in the arrays of SRAM bit cells are mapped to a subset of the address bitmap, and are placed adjacent to the designated location.

2. The SRAM circuit of claim 1, wherein the designated location is lanes defined between innermost arrays of the arrays of SRAM bit cells.

3. The SRAM circuit of claim 1, wherein the designated location is at the center of the arrays of SRAM bit cells.

4. The SRAM circuit of claim 1, wherein the subset of the address bitmap defines a contiguous address range.

5. The SRAM circuit of claim 4, wherein the contiguous address range starts at address 0.

6. The SRAM circuit of claim 1, further comprising a connection to a software system arranged to direct commonly used data in and/or out of the arrays of SRAM bit cells in the subset of arrays placed adjacent to the designated location.

7. The SRAM circuit of claim 1, wherein the arrays of SRAM bit cells are in a power domain distinct from the peripheral circuitry.

8. The SRAM circuit of claim 1, wherein the peripheral circuitry includes both address path facilities and data path facilities, each in a distinct power domain.

9. The SRAM circuit of claim 1, wherein the peripheral circuitry includes both address path facilities and data path facilities, and wherein the designated location is surrounded by the arrays of SRAM bit cells and both the address path facility and the data path facility.

10. The SRAM circuit of claim 1, wherein the peripheral circuitry has a plurality of connected lines to each respective member of the arrays of SRAM bit cells, configured to allow access to a subset of arrays during an operation, wherein the lines not connected to the subset of arrays are not activated during the operation.

11. An array control circuit connected to a plurality of array blocks comprising:
peripheral circuitry connected by signal lines to the plurality of array blocks to access a subset of array blocks during an operation, the peripheral circuitry being positioned at a designated location, with an array decoder for each block of the plurality of array blocks being located at the designated location and sense amplifiers and write drivers for each block of the plurality of array blocks not being locate at the designated location; and
wherein only those signal lines connecting the peripheral circuitry to the accessed subset of array blocks are active during the operation.

12. The array control circuit of claim 11, wherein signal lines connecting the peripheral circuitry to array blocks that are not accessed do not switch during the operation.

13. The array control circuit of claim 11, wherein the operation can be at least one of a write, a read, a standby, and retention operation of a SRAM system.

14. The array control circuit of claim 11, wherein each block in the connected plurality of array blocks has an address, and wherein the addresses of blocks located near the designated location are contiguous.

15. The array control circuit of claim 14, wherein addresses of the blocks located near the designated location start at address 0.

16. The array control circuit of claim 11, wherein at least some of the connected plurality of array blocks are SRAM bit cell array blocks.

17. The array control circuit of claim 11, wherein the designated location is surrounded by the subset of array blocks.

18. The SRAM circuit of claim 11, wherein the designated location is at a center of the subset of array blocks.

19. The SRAM circuit of claim 11, wherein at least some of the plurality of array blocks are SRAM bit cell array blocks in a power domain distinct from the peripheral circuitry.

20. A system with multiple arrays that can be selectively accessed, comprising:
first circuitry positioned adjacent to at least some of the multiple arrays, the multiple arrays accessible and controllable with one or more control signals, and with only circuitry connected to accessed arrays being enabled, wherein the first circuitry is sense amplifiers and write drivers; and
second circuitry generating at least some of the one or more control signals to enable the first circuitry, the second circuitry being at a designated location at a center of the multiple arrays and including array decoders for the multiple arrays, the first circuitry not being at the designated location;
wherein the multiple arrays and the second circuitry are in different power domains.

21. The system of claim 20, wherein transistors of the multiple arrays have a higher threshold than transistors of the second circuitry.

22. The system of claim 20, wherein the designated location is lanes between the multiple arrays.

23. The array control circuit of claim 11, wherein the plurality of array blocks includes at least 16 array blocks.

* * * * *